United States Patent [19]

Tanaka et al.

[11] Patent Number: 4,591,492

[45] Date of Patent: * May 27, 1986

[54] METHOD OF MANUFACTURING CRYSTALLINE SILICON CARBIDE EMPLOYING ACID PRETREATED RICE HUSKS

[75] Inventors: Minoru Tanaka, Kobe; Tadashi Kawabe; Masafumi Kobune, both of Hyogo, all of Japan

[73] Assignee: Tateho Kagaku Kogyo Kabushiki Kaisha, Hyogo, Japan

[ * ] Notice: The portion of the term of this patent subsequent to Mar. 12, 2002 has been disclaimed.

[21] Appl. No.: 689,469

[22] Filed: Jan. 7, 1985

Related U.S. Application Data

[63] Continuation-in-part of Ser. No. 476,199, Mar. 17, 1983, Pat. No. 4,504,453.

[30] Foreign Application Priority Data

Jun. 4, 1982 [JP] Japan ................. 57-96791

[51] Int. Cl.[4] ................. C01B 31/36
[52] U.S. Cl. ................. 423/345; 423/335; 156/603; 156/DIG. 112; 501/88
[58] Field of Search ................. 423/335, 345; 501/88; 156/603, DIG. 64, DIG. 112

[56] References Cited

U.S. PATENT DOCUMENTS

| | | | |
|---|---|---|---|
| 3,754,076 | 8/1973 | Cutler | 423/345 |
| 3,855,395 | 12/1974 | Cutler | 423/344 |
| 4,049,464 | 9/1977 | Tutsek et al. | 423/335 |
| 4,214,920 | 7/1980 | Amick et al. | 423/335 |
| 4,248,844 | 2/1981 | Ramsey, Jr. et al. | 423/345 |
| 4,283,375 | 8/1981 | Horne, Jr. et al. | 423/345 |
| 4,284,612 | 8/1981 | Horne, Jr. et al. | 423/345 |
| 4,293,099 | 10/1981 | Parekh et al. | 209/5 |
| 4,483,839 | 11/1984 | Sugiura et al. | 423/344 |
| 4,504,453 | 3/1985 | Tanaka et al. | 423/345 |

FOREIGN PATENT DOCUMENTS

| | | | |
|---|---|---|---|
| 758530 | 5/1971 | Belgium | 423/345 |
| 49-32719 | 9/1974 | Japan | 423/345 |
| 55-28779 | 7/1980 | Japan | 423/345 |
| 58-143864 | 9/1983 | Japan | 345/ |

Primary Examiner—John Doll
Assistant Examiner—Jackson Leeds
Attorney, Agent, or Firm—Marshall, O'Toole, Gerstein, Murray & Bicknell

[57] ABSTRACT

A method of manufacturing silicon carbide crystals in which a rice husk raw material is pretreated with an acid solution (e.g., 5N to 6N $H_2SO_4$, HCl or $HNO_3$) prior to being heated in a furnace of non-oxidizing atmosphere. Pretreatment of the rice husks in this manner results in silicon carbide crystals of high purity.

9 Claims, 1 Drawing Figure

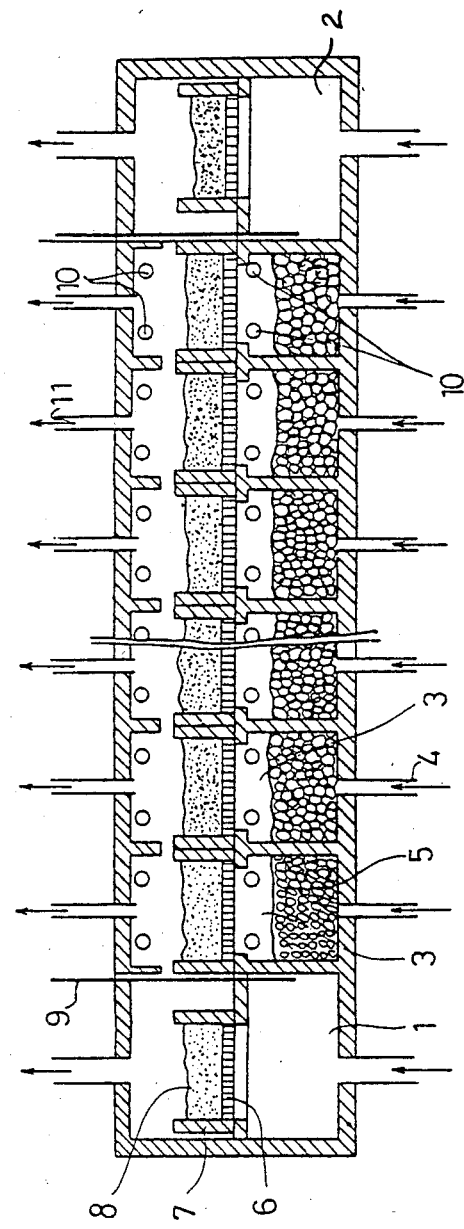

METHOD OF MANUFACTURING CRYSTALLINE SILICON CARBIDE EMPLOYING ACID PRETREATED RICE HUSKS

This application is a continuation in-part of application Ser. No. 476,199 filed Mar. 17, 1983, now U.S. Pat. No. 4,504,453.

BACKGROUND OF THE INVENTION

The present era has been called the "age of the material's revolution", wherein non-ferrous objects have been increasingly utilized in lieu of conventional iron and steel materials. In this context, the use of ceramic materials has become increasingly prevalent, with the result that ceramics now constitutes a "third material" which ranks in usage next to metals and plastics.

Historically, ceramics have been widely used because of their heat resistance, corrosion resistance, and anti-abrasion properties. Recently, new ceramic materials have been developed which take full advantage of these characteristics. Silicon nitride and silicon carbide, in particular, are the rising stars of these new ceramics and are the object of fierce competition in research and development.

Silicon carbide has many advantages such as high strength, high chemical stability, and excellent oxidation resistance to high temperatures. Because of the fact that its crystal structure is similar to diamond, the material is promising as a heat-resistant material for high temperature uses.

Although these materials have attracted a great deal of attention, silicon carbide ceramics are thus far industrially available only in the form of powder or lump.

When in the form of a whisker or "whiskery crystal"—a single unit crystal—silicon carbide exhibits much higher mechanical strength than lump crystals of the same material. Thus whisker crystals of silicon carbide are receiving attention as reinforcing additives for obtaining composite materials of high mechanical strength.

DESCRIPTION OF THE PRIOR ART

The known methods of producing silicon carbide whiskers include, (i) gas-phase reaction methods which either react carbon-containing gas with silicon-containing gas or decompose an organic silicon gas containing both carbon and silicon components, and (ii) solid-material methods which flow a carrier gas through solid materials containing carbon and silicon and form silicon carbide whiskers in a place separate from the reactant material.

One of the defects of the gas-phase method is that it can be self-quenching. The silicon-containing vapor is typically generated by heating a crushed or pelletized silicon containing material in a furnace. If the heated powder or pellet of the material is brought into direct contact with the carbon-containing gas, silicon carbide produced between the powder grains or on the surface of the pellet prevents evaporation of silicon vapor from the interior of the grains or pellets.

A common defect in both the gas-phase and solid-material methods is that whiskers grow on the ceiling and side walls of the furnace. In addition, when whiskers are formed in a separate location as in these cases, the conversion efficiency of the silicon component in the material into silicon carbide whiskers is very low.

Of these two methods, the solid-material methods are much more economically favorable and offer better quantitativity. However, while the over-all yields are better in the latter method, the yield of the desired whisker is very low because most of the material is converted into the undesired silicon carbide lump crystalline product.

BRIEF SUMMARY OF THE INVENTION

It is one of the objects of this invention to provide a simple method of manufacturing silicon carbide in the so-called whisker or whiskery crystal form and in higher yields.

Another object of the invention is to provide a method of separately collecting silicon carbide whiskers grown in the void spaces in the internal and external surfaces of the reactant material, without breaking or fracturing the whisker crystal configuration.

According to one aspect of the invention, to attain these objects, a silicon and carbon-containing material having a thin cross-section and sufficient void spaces (porosity) for growing whiskers therein is charged onto a tray, arranged on the tray to allow circulation of gas through said material, and placed in a furnace having a non-oxidizing atmosphere. The tray is moved intermittently through a series of increasing temperature zones from about 400° C. to 1,300° C., while a non-oxidizing gas such as argon is circulated through said void spaces of the material to remove any impurities. Thereafter, the heated tray is intermittently moved through a series of increased temperature stages from 1,350° C. to 1,450° C., while a gas continues to be circulated through the porous material, to effect carbonizing. The treated silicon-carbide material is dispersed in a mixture of hydrophobic organic liquid and water and left at rest. The desired silicon carbide whiskers can be readily isolated from the water phase.

BRIEF DESCRIPTION OF THE DRAWING

The drawing shows a cross-section of the furnace used in several of the Examples which illustrate various embodiments of the invention. The use of this type of furnace is only an example and is not to be understood to extend to all embodiments of the present invention.

DETAILED DESCRIPTION OF THE INVENTION

The present invention comprises basically two processes. In the first process, a silicon and carbon-containing material having a thin configuration with sufficient porosity to both permit the passage of a gas therethrough and to provide void spaces for growing whiskers therein is charged on a gas-permeable support, such as a perforated tray, under conditions to allow circulation of gas. The tray is heated in a furnace of non-oxidizing atmosphere, and is periodically moved through a series of temperature zones, increasing stage-by-stage from about 400° C. to 1,450° C. While undergoing heating, a sparging gas such as argon or other non-oxidizing gas is circulated through said void spaces of the material, to remove the impurity components by evaporation and blowing off.

At temperatures above 1,300° C. the desired silicon carbide crystals begin to be formed. The heating process is continued and the tray is intermittently moved through temperature zones ranging from 1,350° C. to about 1,450° C. to grow silicon carbide whiskers on the internal and external surfaces of the reactant material. A maximum temperature of less than about 1,425° C. is undesirable because of lessened conversion efficiency, while temperatures in excess of 1,450° C. are not economical. Upon leaving the maximum temperature zone, the material is allowed to cool.

Thereafter, in a second process, the reactant material, having silicon carbide whiskers on the internal and external surfaces thereof, is dispersed in a mixture of hydrophobic organic liquid and water and left at rest. The desired silicon carbide whiskers can be isolated from the water phase.

A suitable natural material which can be used as a silicon/carbon-containing raw material having a thin configuration with sufficient porosity for growing whiskers therein, is rice husks. Rice husks are an essentially commercially-useless by-product in rice growing agriculture, produced in large quantities. Rice husks contain 13 to 22 wt % $SiO_2$, 0.02 to 0.05 wt % MgO, 0.10 to 0.15 wt % CaO, 0.3 to 0.4 wt % $K_2O$, and 0.05 to 0.10 wt % $P_2O_5$, in addition to organic substances. When calcined under closed, air-free conditions, the rice husks retain a ratio of carbon to silicon content from 7:3 to 5:5, with 60% of their weight scattered. The residual carbon content serves to help keep the shape of the rice husks during heating and facilitates the growth of whiskers in the voids in the internal and external surfaces of the calcinated material. $K_2O$ and $P_2O_5$ are blown off during the calcinating and carbonizing process and MgO and CaO can be removed by after-treatment.

When rice husks are utilized as a raw material, pretreatment of the rice husks with a strong acid prior to heating in the furnace will improve the purity and yield of the resultant whisker crystals. Mineral acids such as hydrochloric acid, sulfuric acid and nitric acid are particularly suitable as pretreating agents. Hydrofluoric acid, however, is not acceptable because it will dissolve the silicon in the rice husks.

Mineral acids which have been partially diluted with water are more effective than highly-concentrated solutions. However, excessive dilution with water will lessen the effectiveness of the acid, requiring additional time for the pretreatment step. The amount of water added depends on the concentration of the particular acid. For example, concentrated hydrochloric acid is approximately 12N (normal) and has a density of 1.18 g/ml. Addition of an equal volume of water to the concentrated acid will result in an approximately 6N acid solution which has been found to be satisfactory for acid pretreatment. Concentrated sulfuric acid, on the other hand, is approximately 36N and has a density of approximately 1.84 g/ml. Concentrated $H_2SO_4$ should be diluted with water in a volumetric ratio of one to five to arrive at a 5 to 6N concentration.

The amount of acid utilized in the pretreating step is preferably 10 to 40 liters per kilogram of rice husks (approximately 10 to 40 weight percent, based on the weight of the husks), optimally 20–30 liters/Kg. (approximately 20 to 30 weight percent). The 20 to 30 liter range is particularly appropriate in instances where the mixture of rice husks and acid is agitated during the treating process. After the rice husks are immersed in the acid solution, the mixture may be left at ambient temperature, agitated, heated and agitated, or boiled, depending on the time available. That is, leaving the acid/rice husks mixture in a quiescent state requires a lengthy immersion time in order to be fully effective. Although the application of heat or agitation will lessen the pretreatment time, boiling is most effective. Generally speaking, boiling for a period of 30 minutes to one hour is sufficient for the acid pretreatment, but two hours boiling is preferred.

Upon completion of the acid pretreatment step, the mixture can be filtered, and the filtrate washed with water. The treated filtrate comprises a purified raw material for the generation of silicon carbide whisker crystals. The recovered acid solution can be adjusted with concentrated acid to the desired normality and recycled in the pretreating process.

Silicon, the major component of silicon carbide, is also available in the form of silicic anhydride at low cost. Typical sources of low-cost silicic anhydride include silica sand, Shirasu and waste powder resulting from plate glass manufacture. For example, Shirasu is widely distributed in Japan as a result of volcanic eruptions. The estimated amount of deposit in the southern Kyushu district, alone, is ninety billion (90,000,000,000) tons.

The chemical composition of Shirasu is shown in Table 1.

TABLE 1

| Place of Production | Taniyama Shirasu | | | Furue Shirasu | | |
|---|---|---|---|---|---|---|
| Component | Standard | Light | Heavy | Standard | Light | Heavy |
| $SiO_2$ | 70.2 | 72.6 | 65.4 | 70.5 | 74.8 | 68.7 |
| $Al_2O_3$ | 15.6 | 18.0 | 19.0 | 15.7 | 12.7 | 19.6 |
| FeO | 2.8 | 8.2 | 2.8 | 2.6 | 1.8 | 3.8 |
| $Fe_2O_3$ | | | | | | |
| $CO_2$ | 2.5 | 1.4 | 5.0 | 2.8 | 1.5 | 5.4 |
| MgO | 0.7 | 0.6 | 1.2 | 0.5 | 0.2 | 1.2 |
| $Na_2O$ | 4.0 | 4.4 | 5.4 | 4.2 | 4.4 | 5.0 |
| $K_2O$ | 2.4 | 2.8 | 1.2 | 2.2 | 3.0 | 1.0 |
| Ig-loss | 2.2 | 2.5 | 0.6 | 2.0 | 2.7 | 0.5 |
| Total | 100.4 | 100.5 | 100.6 | 100.5 | 100.1 | 100.2 |

The grinding of plate glass in the glass industry produces large quantities of waste powder. This super-fine powder has too high of an iron content to allow its reuse in glass-making. Its chemical composition is shown in Table 2.

TABLE 2

| $SiO_2$ | $Al_2O_3$ | $Fe_2O_3$ | CaO | MgO | $Na_2O$ | $K_2O$ | Total |
|---|---|---|---|---|---|---|---|
| 50.9 | 22.0 | 16.1 | 8.2 | 2.1 | 5.1 | 0.7 | 100.1 |

It is preferred to use a mixture of Shirasu and waste powder from glass plate grinding process rather than to use them separately. Shirasu is vitrified at fairly low temperatures with decreased surface area, making silicon-containing vapor hard to produce. On the other hand, if a layer of Shirasu is arranged so that it is supported by the plate-glass grinding waste powder, it is relatively easy to produce the desired silicon-containing vapor for a longer period of time. Moreover, the iron oxide contained in the waste powder as an impurity has an effect of accelerating whisker growth.

Raw materials for carbon are industrially available in large quantities and in pure form. The silcon and carbon materials can be kneaded together with the addition of methyl cellulose as a sticking agent, and molded into thin configurations such as a short hollow pipe, a twisted flake, corrugated plate, or entangled threads. When piled up, these configurations facilitate both the passage of gas and the formation of sufficient spaces to grow whiskers therein. Raw materials which have voids in themselves, like carbonized rice husks, or materials which have a shape of short hollow pipe are particularly preferable.

As another material, it is preferable to use high-purity cellulose such as filter paper impregnated with silicon resin, dried and molded, for example, into corrugated form.

No matter what raw material is utilized, it is necessary to charge the material onto the perforated tray in a manner permitting the easy passage of gas.

To aid in the formation of silicon carbide whisker, the reactant material is preferably treated with a mixture of one or more types of boron compounds and lanthanum compounds by spraying as liquid or by applying as powder, before charging on the tray. The amount of addition is empirically 1 to 40% by weight, preferably 5 to 20% by weight, most preferably 7 to 15% by weight of boron compound, lanthanum compound, or mixture thereof, based on the weight of Si in the material.

The gas-permeable tray charged with the material is then introduced into a furnace of non-oxidizing atmosphere. The interior of the furnace is divided into a plurality of temperature zones increasing stage-by-stage from about 400° C. to 1,450° C.; for example, 400° C., 500° C., 600° C., 700° C., 1,100° C., 1,200° C., 1,300° C., 1,350° C., and 1,450° C., respectively. A non-oxidizing gas, such as argon, is continuously circulated through the furnace in the direction from lower to higher temperature.

The tray is moved through the temperature zones in the direction from lower to higher temperature at specified time intervals. During this process, the material on the tray is heated, and after the impurity contents have been scattered, the silicon content in the material is carbonized. The time required to purge impurities while the tray is being intermittently moved is between 1 and 24 hours per zone, preferably 5 to 24 hours for each temperature zone of 400° C., 500° C., 600° C., 700° C., 900° C., 1,100° C., 1,200° C. and 1,300° C. The time during which silicon content in the material is carbonized in the temperature zones from 1,350° C. to 1,450° C. is 2 to 10 hours, preferably 4 to 10 hours. Flow rate, flow speed, and temperature of non-oxidizing gas vary, depending upon the internal volume of the furnace and the amount of material charged into the furnace.

The silicon carbide whiskers formed on the internal and external surfaces of the reactant material are recovered in the form of single crystals by the following procedure: When removed from the furnace, the material on the tray has its internal and external surfaces covered with a tangle of intertwined silicon carbide whiskers. The material is put into water and stirred slowly to avoid damage to the whiskers. In that regard, stirring may best be effected by methods such as aeration or ultrasonic wave, rather than by mechanical stirring.

When the material has loosened somewhat, there is added to it a hydrophobic organic liquid such as kerosine, and a quantity of a strong acid, preferably hydrochloric acid. The mixture is then heated to 40°–50° C. while being stirred slowly, and allowed to stand still for a while. When the water and kerosine phases separate from each other, the whiskers will have moved into the bottom water phase and the other components of the material will have moved into the top kerosine phase. The addition of hydrochloric acid increases the hydrophilic properties of the whiskers and provides earlier and more complete settling of the whiskers into the aqueous phase. The whiskers caught in the water phase can be purified in high efficiency by flotation techniques by use of a commercial detergent or metal soap, but a series of simple water washings serves to remove most of the impurities, giving pure silicon carbide whiskers.

Kerosine and hydrochloric acid may be added to water in advance. An auxiliary dispersant may be added to help loosen the material in water, but care should be taken to select a dispersant that does not emulsify the organic liquid. Although the cooked material containing silicon carbide whiskers may be mechanically loosened before the liquid separation step, some damage to the whiskers is unavoidable if such a procedure is attempted.

The material caught in the kerosine phase contains a powder of the same chemical composition as that of the whiskers, as well as some carbon-containing impurities. By burning this residue in the presence of oxygen at temperatures below 1,000° C., any carbon impurities will be removed, leaving only silicon carbide powder. This "waste" powder can be used as an abrasive, as a raw material for the ceramics' industry, or as a material for high-temperature ceramics.

It is also possible to avoid the purification step utilizing the two phase organic solvent/water separation method. If the material removed from the furnace is burned directly without separation and purification, a mixture of silicon carbide whisker and silicon carbide powder is obtained, which can be used as a material of high-mechanical strength for high-temperature ceramics.

An embodiment of the furnace used in the industrial application of the invention is described in the attached drawing. The drawing is a fragmentary plan view (the center portion not shown) showing the cross section of a furnace which has its outer structure and interior partitions made of heat-resistant material. The furnace is provided at both its ends with an inlet gas replacing chamber (1) and outlet gas replacing chamber (2), and divided into upper and lower stages. The lower stage is provided with a number of small chambers (3) having an open top and a gas blowing port (4) attached to the bottom. The small chambers (3) accommodate a quantity of carbon pellets (5). In the upper stage, trays (7) are arranged in each of said small chambers. The bottom of the trays (7) are provided with a large number of holes (6) small enough to prevent reactant material (8) from falling through. The tray may be formed of silica-alumina, but graphite is more favorable since it provides higher thermal shock resistance when moved into higher or lower temperature zones.

An embodiment of a manufacturing process according to the invention is hereinafter described with reference to the drawing. A tray (7) charged with material (8) such as rice husks is placed over the inlet gas replacement chamber (1) into which a non-oxidizing gas is fed and tray (7) is allowed to come to equilibrium with the non-oxidizing atmosphere. Door (9) is pulled up to an open position, and tray (7) is moved above the small chamber (3) (at the left end of the drawing) which is set to the lowest temperature in the furnace. Each of the small chambers (3) to the right of this first chamber are set to successively higher temperatures. Each small chamber (3) is filled with an adequate quantity of carbon pellets and provided with a resistance heating element (10) to keep a specified temperature (400° C. for example). Since the non-oxidizing gas (argon gas, for example) is blown upward through the gas blowing port (4) at a specified flow rate and in a specified quantity, material (8) on tray (7) is gradually heated by the hot gas flowing in from the small holes provided in the bottom of the tray. Gas exits through an outlet (11). Though partly omitted in the drawing, there are provided, in a preferred embodiment, about 20 small chambers in total. The chambers are held, in series, at temperatures from about 400° C. to 1,200° C., in 100° C. increments, each temperature zone including one or two small chambers. Because the desired whisker crystal growth is initiated at about 1,300° C., in the preferred furnace apparatus, three chambers are held at 1,300° C., and four chambers each are set to 1,350° C. and 1,450° C. As shown in the drawing, a space large enough to accommodate one tray is provided directly above each of these small chambers.

The furnace apparatus provides a means whereby material on a series of trays can be intermittently moved into a preheated small chamber, held for a specified time, and thereafter moved to a chamber at a higher temperature. The temperature range from 400° C. to 1,300° C. constitute preheating to remove contaminants, whereupon the material is carbonized in the temperature range from 1,350° C. to 1,450° C., and then cooled to room temperature.

Since impurities such as Na, Cl, K, Mg, and Al, are gradually scattered and crystallized on the ceiling of the furnace while the tray is moving through the furnace body, the purity of silicon carbide whisker and powder produced on the inner and outer surfaces of the reactant material by the reaction of silicon containing vapor with carbon containing vapor at 1,350° C. to 1,450° C. is dramatically increased.

Table 3 shows experimental data which demonstrates that the impurities decrease as the temperature increases in the various temperature zones in the furnace. That is, the purity of silicon carbide increases as the reactant material passes through zones of higher temperatures.

TABLE 3

|    | 700° C. | 800° C. | 900° C. | 1,000° C. | 1,100° C. | 1,200° C. | 1,300° C. | 1,400° C. |
|----|---------|---------|---------|-----------|-----------|-----------|-----------|-----------|
| Na | 100 | 100 | 89  | 70  | 41  | 9   | 1   | 0   |
| Mg | 100 | 100 | 100 | 100 | 100 | 94  | 89  | 67  |
| Al | 100 | 100 | 100 | 100 | 100 | 99  | 94  | 82  |
| P  | 100 | 100 | 100 | 94  | 89  | 80  | 72  | 53  |
| S  | 100 | 100 | 94  | 86  | 70  | 61  | 48  | 19  |
| Cl | 100 | 100 | 97  | 89  | 78  | 48  | 18  | 0   |
| K  | 100 | 100 | 100 | 97  | 98  | 79  | 68  | 20  |
| Ca | 100 | 100 | 100 | 100 | 97  | 91  | 82  | 70  |
| Fe | 100 | 100 | 100 | 100 | 98  | 95  | 98  | 78  |

The above experimental data reflect the amount of each element left in the material after it was heated for 2 hours at each temperature, when compared to the same element when analyzed after heating at 700° C. (amount of element at 700° C.=100 parts). As shown by the data for 1,400° C., the proportion of each impurity in the material has significantly decreased, resulting in a corresponding increase in the purity of the desired silicon carbide.

Table 4 presents the results of fluorescent X-ray analysis of impurity elements scraped from the ceiling of the furnace at the conclusion of the experiment illustrated in Table 3. This material was removed from the reactant material by the action of heat and the passage of the inert gas and recrystallized on the ceiling of the furnace.

TABLE 4

(unit: %)

| | Temperature Zone in Furnace | | | | | |
|---|---|---|---|---|---|---|
|    | Inlet Zone | 700° C. Zone | 1000° C. Zone | 1300° C. Zone | 1400° C. Zone | Cooling Zone | Outlet Zone |
|----|------|------|------|------|------|------|------|
| Na | 8    | 5    | 3.1  | 2    | 0    | 2.1  | 2    |
| Mg | 0.5  | 1.4  | 0.5  | 0.6  | 0.05 | 2.8  | 0.7  |
| Al | 0.1  | 0.1  | 0.1  | 0.3  | 2.4  | 0.1  | 0.2  |
| P  | 9    | 2    | 4.4  | 4.0  | 0.08 | 3.0  | 7.8  |
| S  | 7    | 5    | 4.0  | 3.8  | 0.05 | 4.2  | 4.3  |
| Cl | 24   | 5    | 6.2  | 5.0  | —    | 4.1  | 4.2  |
| K  | 26   | 6    | 13   | 7.5  | 0.07 | 3.1  | 2.9  |
| Ca | 0.05 | 0.05 | 0.05 | 0.70 | 0.70 | —    | —    |
| Fe | 0.20 | 0.80 | 0.34 | 0.40 | 0.78 | 0.35 | 0.76 |

These experimental data demonstrate that relatively large amounts of impurity elements are scattered and crystallized on the furnace ceiling in the starting stage of preheating (400° to 650° C.), but that the deposits decrease as the temperature is increased to 700° C., 1,000° C., 1,300° C., and 1,400° C. However, in the furnace's cooling zone (room temperature) and in the gas outlet, a slight increase in the quantity of impurity elements is observed.

It is believed that this analysis of impurity elements, which reveals that various impurities, though different depending upon the type and temperature, are recrystallized on the ceiling from the inlet to the outlet of the furnace, further confirms the purity of the silicon carbide whiskers formed on the external and internal surfaces of the material in the tray at the furnace outlet. It is hypothesized that the larger amount of impurity elements observed in the cooling zone and the gas outlet, when compared to the high temperature zones, (from 1,350° C. to 1,450° C.) is due to the condensation of scattered impurity elements by the rapid temperature drop.

Comparative experimental data to demonstrate the effect of a mixture of one or more types of boron compounds and lanthanum compounds added to the raw material as a crystal growth accelerator are shown in Table 5.

TABLE 5

|   | Yield of SiC whisker manufactured by basic process according to the invention (Conversion rate of Si in material into SiC whisker) |
|---|---|
| Added with $H_3BO_3$ (15% by weight of Si in material) | 84.6% |
| Added with $LaCl_3$ (15% by weight of Si in material) | 61.2% |
| None | 35.0% |

As obvious from the above comparative experimental data, the yield of SiC whisker is increased conspicuously to 84.6% by the addition of $H_3BO_3$ accelerator and to 61.2% by the addition of LaCl3, as compared with 35.0% crystal whisker when no growth accelerator is added.

Acid pre-treatment before the heating step will aid in the removal of impurities and organic compounds from the material, and will permit more effective treatment after the reaction has been completed. An example of acid pretreatment of rice husks is now described.

Raw rice husks are boiled in 5N-HCl solution for 0.5-1 hour. This reduces cellulose, the main component of the rice husks; that is, the carbohydrate is deoxidized and converted into low-molecular blackened compounds. The proteins in the rice husks are decomposed into amino acids. These decomposition products are eluded upon heating, leaving porous rice husks. This treatment facilitates the scattering of impurities from the rice husks, reaction of silicon with carbon, and growth of silicon carbide whiskers.

The results of fluorscent X-ray analysis of the elemental content of rice husks after being boiled in 5N-HCl and washed is set forth in Table 6. The results are expressed in parts, where 100 parts represents the elemental content of the raw (untreated) rice husks. The efficacy of the use of the acid as a pre-treatment is demonstrated by the data in the last column which shows a post-treatment of the material with acid. There, raw rice husks were calcinated by heating in accordance with the procedures previously outlined, and then boiled in 5N-HCl. Pre-treatment is far more effective.

TABLE 6

| | Type of element contained in rice husks | Element Content in rice husks after acid treatment | Element content in rice husks acid-treated after calcination (reference) |
|---|---|---|---|
| 1 | Na | 100 | 0 | 0 |
| 2 | Mg | 100 | 0 | 69 |
| 3 | Al | 100 | 71 | 31 |
| 4 | Si | 100 | 100 | 100 |
| 5 | P | 100 | 2 | 43 |
| 6 | S | 100 | 11 | 120 |
| 7 | Cl | 100 | 0 | 85 |
| 8 | K | 100 | 2 | 30 |
| 9 | Ca | 100 | 6 | 41 |
| 10 | Fe | 100 | 19 | 55 |
| 11 | Mn | 100 | 4 | 72 |
| 12 | Ni | 100 | 71 | 115 |
| 13 | Cu | 100 | 71 | 130 |
| 14 | Zn | 100 | 18 | 85 |

If industrial quantities of product are desired, a vertical furnace may be more desirable than the furnace depicted in the accompanying drawing. Operation of the illustrated furnace, while satisfactory from a technical point of view, is labor intensive. In the vertical furnace, raw material is intermittently fed into the top of the furnace by a screw feeder, and dropped from the preheating zone into the carbonizing zone at specified time intervals until finally removed from the bottom of the furnace when the reaction is completed. In this case, use of a porous tray is not required.

From the material laden with silicon carbide whiskers and powder, formed as a result of the specified treatment in the furnace, only the silicon carbide whiskers will pass into the aqueous phase when treated with a mixture of hydrophobic organic liquid, water, and hydrochloric acid.

Unlike conventional methods, in the method of the present invention, silicon carbide is formed on the internal and external surfaces of the reactant material, rather than on a surface separated from the material. Thereafter, silicon carbide whiskers can be obtained in a very high yield, by treating the material after carbonizing with a mixture of a hydrophobic organic liquid (such as kerosine), water, and hydrochloric acid. In addition, nearly all silicon content in the material can be converted into silicon carbide.

It is also possible to use the whiskers produced without passing through a separating process. When the liquid separation step is omitted, the product will be less pure— in the form of a mixture of silicon carbide powder, silicon carbide whisker, and carbon; or a mixture of silicon carbide powder and silicon carbide whisker, with the carbon burned out.

The process according to the invention is very economical in cost, since the raw materials to be used are available in large quantities at very low prices, being carbonized rice husks, silica sand, raw material of silica anhydride, shirasu, and waste powder from plate glass grinding.

The following examples illustrate specific embodiments of the claimed invention:

EXAMPLE 1

Thirty grams of rice husks having chemical analyses of ignition loss: 79.61%, $SiO_2$: 17.55%, $Al_2O_3$: 0.04%, $Fe_2O_3$: 0.01%, CaO; 0.04%, and MgO: 0.16% were calcinated at 900° C. in an air-tight vessel, and then arranged on a graphite tray having a perforated bottom. The uncovered tray was placed above a 5 mm thick layer of carbon pellets in an alumina muffle furnace constructed as shown in the drawing. The rice husks on the graphite tray were heated and held at 800° C. for 3 hours, at 1,000° C. for 3 hours, and at 1,200° C. for 3 hours, while argon gas was kept flowing from the bottom to the top through the tray at a rate of 0.5 l/min. Thereafter, the temperature was raised at a rate of 3° C./min. to 1,400° C. with argon gas kept flowing. When the temperature reached 1,400° C., the flow of argon gas was increased to 5 l/min. and the material was maintained under these conditions for a period of 8 hours. After this, the temperature was lowered to 1,000° C. with argon flow rate decreased to 0.5 l/min. Finally, the system was closed and allowed to cool down with the argon flow stopped.

Treated material in the tray was put in a 3:7 mixture of kerosine and water (tap water) and slowly stirred for 1 hour and left at rest. As the solution separated into a bottom water phase and a top kerosine phase, carbide whiskers were caught in the water phase and carbide powder was caught in the kerosine phase.

Silicon carbide whiskers, separated into the water phase, were treated by flotation technique and gave 2.9 g of whiskers. It was shown by electron microscopic observation that these whiskers were about 0.2μ in diameter and about 60μ in length, and it was observed by limited field electron diffraction that each whisker was a single crystal of α-SiC.

Carbon powder caught in the kerosine phase was calcinated at 900° C. for 2 hours in an oxidizing atmosphere and gave 13 g of a grayish white powder. Most of this component was shown to be α-SiC by electron diffraction.

EXAMPLE 2

Thirty grams of the same raw material as in Example 1 was added with 1.69 g of $H_3BO_3$ (99.5% pure) and reacted and separated in the same manner as in Example 1, yielding 7.4 g of α-SiC whiskers.

EXAMPLE 3

Thirty grams of the same raw material as in Example 1 was added to 1 g of $LaCl_2$ and reacted and separated in the same manner as in Example 1, yielding 7.4 g of α-SiC whiskers.

EXAMPLE 4

Pulverized Shirasu (volcanic sand from Furue in the west of Shikaya City in Kagoshima Pref., Japan, containing 15–75% silicic anhydride), adjusted to 200 mesh or less, was combined with both waste powder from glass grinding adjusted to 325 mesh or less, and carbon powder adjusted to 200 mesh or less, and mixed in proportions of 40 wt % sand, 20 wt % waste powder, and 40 wt % carbon, respectively. A small amount of methylcellulose solution was kneaded into the composition to bind the material together. The viscous or plastic material was then extruded into short hollow pipes of OD 5×ID 4×L 5 mm and air-dried. This material was calcinated by the same method and in the same furnace as used in Example 1. Treatment of the reacted material with kerosene/water stirring gave 20 wt % whisker and 80% powder.

It was shown by electron microscope observation that the whiskers were about 2μ in diameter and about 100μ in length and by X-ray diffraction that the whisker is a complete single crystal of α-SiC, while the powder is α-SiC mixed with some impurities.

As illustrated in U.S. application Ser. No. 476,200, filed Mar. 17, 1983, in the name of M. Tanaka and T. Kawabe, now U.S. Pat. No. 4,525,335, silicon nitride whisker crystals can be formed from a carbon silicon containing material by heating under similar conditions, while circulating a nitrogen-containing gas through the material. The addition of a small amount of $\beta$-$Si_3N_4$ to the silicon and carbon containing material prior to heating accelerates silicon nitride crystal growth in the same manner as $H_3BO_3$ or $LaCl_3$ in the present invention. The silicon nitride whisker crystal will pass into the aqueous phase of a two-phase mixture of organic solvent and water and can be isolated therefrom.

What is claimed:

1. In a method for manufacturing silicon carbide wherein rice husks are employed as a silicon and carbon containing raw material, the improvement comprising:
    (a) pretreating said rice husk raw material by admixing therewith an acid solution;
    (b) maintaining said rice husk raw material in the presence of said acid solution for a period of at least one-half hour;
    (c) removing said acid solution from said rice husk raw material;
    (d) arranging the acid treated raw material on a gas-permeable, heat-resistant support in a manner allowing the passage of a gas through said raw material;
    (e) placing the material-bearing support in an air tight furnace, said air tight furnace adapted to provide at least three temperature zones covering the range of about 400° C. to a high of at least 1,350° C., each of said temperature zones having a substantially different temperature;
    (f) moving said material-bearing support successively through said temperature zones, in the direction of increasing temperature;
    (g) maintaining said material-bearing support means in each of said temperature zones for at least one hour;
    (h) passing a non-oxidizing gas through the heated material to remove impurities while the material is in each temperature zone below 1,300° C.; and,
    (i) removing silicon carbide whisker-containing material from said furnace.

2. The method as recited in claim 1 wherein said air tight furnace includes at least one temperature zone having a temperature in excess of 1,400° C.

3. The method according to claim 1 wherein said acid is a mineral acid selected from the group consisting of hydrochloric acid, nitric acid and sulfuric acid.

4. The method according to claim 1, further including the step:
    boiling the mixture of rice husk raw material and acid solution for a period of approximately two hours.

5. The method according to claim 1, further including the step:
    intermittently agitating the mixture of rice husk raw material and acid solution.

6. The method as recited in claim 1 wherein said rice husk raw material is maintained in each temperature zone in the range 400°–1,300° C. for 1 to 24 hours and in each temperature zone above 1,300° C. for 2 to 10 hours.

7. The method of claim 1, further including the step:
    treating said rice husk raw material with an accelerator selected from the group consisting of boron compounds and lanthanum compounds prior to heating in said furnace.

8. The method of claim 1 wherein the weight of said acid solution in the mixture is between 10 percent and 40 percent of the weight of said rice husk raw material.

9. The method of claim 1 wherein the weight of said acid solution in the mixture is between 20 percent and 30 percent of the weight of said rice husk raw material.

* * * * *